(12) United States Patent (10) Patent No.: US 7,436,507 B2
Moribe (45) Date of Patent: Oct. 14, 2008

(54) METHOD AND APPARATUS FOR INSPECTING A PATTERN

(75) Inventor: Hideyuki Moribe, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 11/761,480

(22) Filed: Jun. 12, 2007

(65) Prior Publication Data

US 2007/0292015 A1 Dec. 20, 2007

(30) Foreign Application Priority Data

Jun. 20, 2006 (JP) ............................. 2006-170327

(51) Int. Cl.
*G01N 21/00* (2006.01)
*G06K 9/00* (2006.01)

(52) U.S. Cl. .................. 356/237.4; 356/237.5; 382/145

(58) Field of Classification Search ........................ None
See application file for complete search history.

(56) References Cited

U.S. PATENT DOCUMENTS 6,836,560 B2 * 12/2004 Emery ........................ 382/145

FOREIGN PATENT DOCUMENTS

| JP | 4-229863 A | 8/1992 |
|----|------------|--------|
| JP | 6-331321 A | 12/1994 |
| JP | 7-83620 A | 3/1995 |
| JP | 9-257444 A | 10/1997 |
| JP | 2002-519667 A | 7/2002 |
| JP | 2002-287327 A | 10/2002 |

* cited by examiner

*Primary Examiner*—Gregory J. Toatley, Jr.
*Assistant Examiner*—Gordon J Stock, Jr.
(74) *Attorney, Agent, or Firm*—Sughrue Mion, PLLC (57) ABSTRACT

An apparatus for inspecting a fine pattern with a simple configuration is provided. The apparatus mainly comprises a scanning unit for scanning a surface of the pattern using a light spot, a reflection detecting unit for detecting one of the light beams having been separated from a light beam reflected at the pattern and outputting a first light intensity signal, an astigmatism detecting unit for creating a second light intensity signal including a phase information on the other light beam having been separated, and an image processing unit for creating an inspection result of the pattern based on the first and second light intensity signals.

19 Claims, 8 Drawing Sheets

METHOD AND APPARATUS FOR INSPECTING A PATTERN

BACKGROUND OF THE INVENTION

1. Field of the Invention

The present invention relates to a pattern inspection method and a pattern inspection apparatus, and in particular relates to a pattern inspection method and a pattern inspection apparatus which are used for detecting a defect formed on a phase shift mask or the like used by a lithography technology.

2. Description of the Related Art

In recent years, with increase of integration degree of a semiconductor integrated circuit, a lithography technology capable of forming a finer pattern than a conventional one has been needed. As one of lithography technologies capable of forming a fine pattern, a lithography technology using Phase Shift Mask (PSM) is known. There are two kinds of PSM, an Attenuated PSM (hereinafter, Att-PSM) in which a member for shifting a phase of an exposure light is arranged to one of adjacent light transmission patterns, and an Alternating PSM (Alt-PSM) including a trench on a base of the photomask. In the PSM, a high contrast can be obtained by using interference between transmitted lights which have different phase from each other. The Att-PSM may be described as Half Tone PSM, and the Alt-PSM may be described as Levenson PSM. Conventionally, a photomask used for a usual lithography is a binary mask. The binary mask is the photomask on which a light shielding pattern made of a metallic film or the like on a glass substrate is formed. The binary mask does not shift a phase of an exposure light.

In order to expose a fine pattern by using a phase shift mask, it is important that a position and a size of a usual pattern for a light shielding and a phase shifter are exactly consistent with design data. The phase shifter is a part of a pattern of a photomask and is a pattern for shifting a phase of a transmitted light. Therefore, a method for detecting a defect is required, the defect meaning that a position and a size of a pattern of a photomask are not consistent with design data. In recent years, inspection technologies for a photomask, e.g. a phase shift mask, using an interference effect of light are desired.

Under such background, various methods for inspecting a photomask have been invented. A method for inspecting a phase shift of the PSM includes, for example, a method using interference of light. For example, a method using an optical heterodyne interferometry is disclosed in Japanese Patent Application Laid-Open No. Hei 6-331321. In Japanese Patent Application Laid-Open No. 2002-287327, a method using a differential interference microscope is disclosed. A defect of a phase shifter is described as "phase defect", hereinafter.

As one of methods for inspecting a phase defect of a PSM that use diffraction and scattering of light, there is a method which uses an analysis of a Fourier transform image of a transmitted light having passed through a phase shift pattern or a reflected light having been reflected by the phase shift pattern, wherein the PSM is uniformly illuminated. This method is disclosed in, for example, Japanese Patent Application Laid-Open No. Hei 4-229863. Additionally, there is a detection method in which only a scattered and diffracted light having been scattered and diffracted by a phase shift pattern are detected through a spatial filter on a Fourier transform plane, wherein the a phase shift pattern is obliquely illuminated. This method is described in Published Japanese translation of PCT application No. 2002-519667.

As one of methods to detect a mask pattern defect with a two-dimensional shape, there is a Scanning Optical Microscopy (SOM). In an SOM, a light beam is concentrated on a surface in which a pattern of a photomask is formed and the pattern is scanned. A pattern shape is observed by detecting a transmitted light and a reflected light from the surface. Since an SOM has a feature of concentrating light, a high S/N ratio can be obtained. Therefore, an SOM is particularly advantageous for a reflective inspection. A pattern defect with a two-dimensional shape is described as "shape defect" hereinafter.

In Japanese Patent Application Laid-Open No. Hei 7-083620, a laser displacement meter for measuring a very small height of an object is described. Usually, electronic components whose heights are different each other are mounted on a printed wiring board. Additionally, a reflectivity of a surface of a printed wiring board is not uniform. This laser displacement meter can measure a small height difference on a surface of a printed wiring board. This laser displacement meter includes a light projection optical system which scans an object with a laser beam and a light receiving optical system which receives a reflected light from the object. The light receiving optical system concentrates a reflected light including astigmatism and receives the reflected light with a quadrant detector to measure a height of the object. In Japanese Patent Application Laid-Open No. Hei 9-257444, a disk test apparatus which applies a laser beam to a disk surface, receives a reflected light from a disk by an astigmatic method and detects a distance from a reflecting surface by using a quadrant detector is disclosed.

However, the above-mentioned conventional art has a problem as shown below.

In the technology described in Japanese Patent Application Laid-Open No. Hei 6-331321 and Japanese Patent Application Laid-Open No. 2002-287327, two light beams whose positions are slightly displaced from each other are applied to an object and interference of two lights is utilized. Therefore, detection ability depends on a direction where two beams are displaced. Additionally, a detectable range of a pattern line width depends on a distance between two displaced beams.

A technology described in Japanese Patent Application Laid-Open No. Hei 4-229863 is a method in which a phase variation amount, that is only a film thickness of an object, is basically measured and a very small defect of a pattern is not an object to be detected. This technology has been invented based on an analysis of a Fourier transform image in a general imaging method using a uniform illumination like a projection exposure apparatus. Therefore, a control of an illumination has to be correctly performed so as to uniformly illuminate both of regions where a phase shifter is added and where a phase shifter is not added.

The technology described in Published Japanese translation of PCT application No. 2002-519667 is one of methods which are generally used for detecting a defect of a semiconductor wafer etc. That is, in this technology, a defect is detected by measuring and analyzing a scattered light or a diffracted light from an area which is illuminated by dark field illumination or bright field illumination by using a light source of a laser or the like. Various methods have been invented as a technology to serve the same purpose as mentioned above. In these methods, S/N ratio of a very weak scattered light and diffracted light from a microscopic defect has to be improved. Published Japanese translation of PCT application No. 2002-519667 discloses a detection method in which in order to improve S/N ratio and determine a type of a defect, a spatial filtering is performed to a diffracted light in a far field region. In this method, various scattered lights or diffracted lights are generated based on a pattern shape and a defect shape of an object to be detected. Therefore, in order to capture the scattered light or diffracted light, setting of an angle of an illumination light, arrangement of a light receiving system, selection of a spatial filter type or the like, which are complicated, are required.

A defect detection apparatus using an SOM detects only a total amount of light. Therefore, the apparatus lacks detection ability for a pattern defect having a reflectivity which is same as the other part at a wavelength of an inspection light. The apparatus lacks detection ability to detect a defect which changes only a phase of light such as a phase defect.

Specifically, a phase defect of the Alt-PSM means a defect in which a trench part in a photomask base is formed at an incorrect position or means a defect in which the trench part is not formed at a correct position. Thus, a phase defect of the Alt-PSM is located on a glass substrate of a photomask. A region having a phase defect and a normal region are formed with glass material. Therefore, a reflectivity at a wavelength of an inspection light at a defect region is equal to a reflectivity at a normal region.

A phase defect of the Att-PSM is a defect in which a translucent light shielding film for shifting a phase of an exposure light is formed at a region where the film is not needed or a defect in which the film is not formed at a region where it is needed. Also, a phase defect includes a defect in which a thickness of a light shielding film is not a normal even though the light shielding film is formed at an appropriate region. In this case, a reflectivity at a wavelength of an inspection light at a defective region is equal to a reflectivity at a normal region.

In the technology described in Japanese Patent Application Laid-Open No. Hei 7-083620 and Japanese Patent Application Laid-Open No. Hei 9-257444, a height of an object or a flatness of a disk can be detected by using an astigmatic method. An astigmatic method is a well-known method that is commonly used for an automatic focus adjustment or the like. In the technology, a phase defect of a photomask can be detected using an astigmatic method. However, both of a shielding pattern on a photomask and a phase distribution of a reflected light cannot be detected.

SUMMARY OF THE INVENTION

The present invention was made to solve the foregoing and other exemplary problems, drawbacks, and disadvantages. A first exemplary feature of the present invention is to provide a method and an apparatus for inspecting a highly fine and high accuracy pattern, the method and apparatus including a simple configuration, being able to perform a high-speed process, having no dependency on a shape of a pattern or a direction of the pattern being formed.

An apparatus for inspecting a pattern has a light source which emits a light beam, a condenser which concentrates the light beam on the pattern to form a light spot, a scanning unit which scans the pattern using the light spot, a beam splitter which separates a light beam reflected from a position of the light spot on the pattern into a first reflected light beam on a first optical path and a second reflected light beam on a second optical path, a reflection detecting unit which receives the first reflected light beam and outputs a first light intensity signal, an astigmatism detecting unit which receives the second reflected light beam and outputs a second light intensity signal by an astigmatic method which second light intensity signal represents a distribution of a phase of the second reflected light beam and an image processing unit which outputs an inspection image signal representing an inspection result of the pattern based on the first light intensity signal and the second light intensity signal.

According to the present invention, in an inspection of a pattern, an intensity detection of a reflected light and an astigmatic method is used. Therefore, the invention has an advantage that an inspection of a pattern including a phase defect and a pattern defect can be readily performed at high speed.

Since a single beam spot is applied to a pattern that is an object to be inspected, inspection ability has no dependency on a pattern shape or a direction of the pattern being formed. Moreover, since a defect detection signal that is the same as that of a conventional pattern defect inspection is obtained, the invention has an advantage that a conventional algorithm for detecting a defect can be used.

Moreover, since light is concentrated, it has an advantage that high S/N ratio can be secured and that a defect detection signal which is buried in noise can be reduced.

Other exemplary features and advantages of the present invention will be apparent from the following description taken in conjunction with the accompanying drawings, in which like reference characters designate the same or similar parts throughout the figures thereof.

BRIEF DESCRIPTION OF THE DRAWINGS

Exemplary features and advantages of the present invention will become apparent from the following detailed description when taken with the accompanying drawings in which.

DETAILED DESCRIPTION OF THE EXEMPLARY EMBODIMENTS

Exemplary embodiments of the present invention will now be described in detail in accordance with the accompanying drawings.

1. First Exemplary Embodiment

Figure 1:
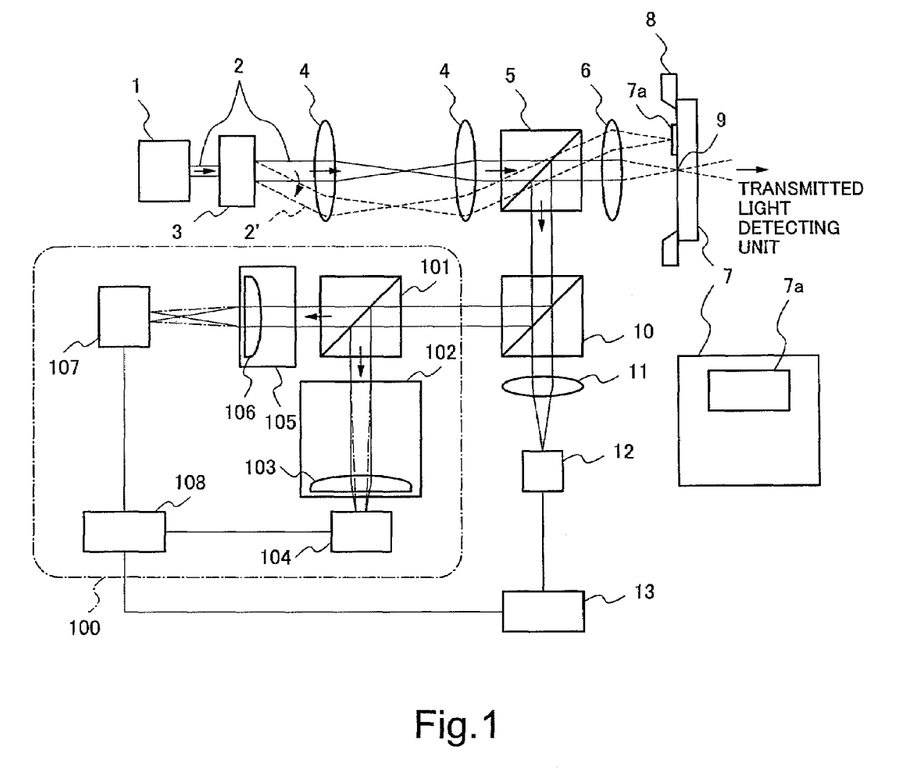
FIG. 1 is a block diagram showing a configuration of a photomask inspection apparatus of a first exemplary embodiment and a second exemplary embodiment according to the present invention.

Hereinafter, the first exemplary embodiment according to the present invention will be described in detail with reference to drawings. First, a photomask inspection apparatus of the embodiment will be described. FIG. 1 is a block diagram showing a configuration of the photomask inspection apparatus of the embodiment.

In the embodiment, an Alt-PSM is taken as an example of a photomask. The inspection apparatus of the embodiment includes a light source 1, a scanning optical system 3, a relay optical system 4, a beam splitter 5, an objective lens 6, a drive stage 8, a transmitted light detecting unit (not shown), a beam splitter 10, a lens 11, an photoelectric converter 12, an astigmatism detecting unit 100 and an image processing unit 13. Thus, the inspection apparatus of the embodiment includes the light source, a condenser lens, a scan function and a light receiving unit and also includes a function of a scanning optical microscope.

The light source 1 generates a light beam 2 for an inspection. The scan optical system 3 changes a beam diameter of the light beam 2 to a predetermined diameter, and deflects and emits the light beam 2. The objective lens 6 concentrates the light beam 2 transmitted through the beam splitter 5. The drive stage 8 can hold an Alt-PSM 7 and can move the Alt-PSM 7 in a perpendicular direction to the plane of FIG. 1. The transmitted light detecting unit receives the light beam 2 transmitted through the Alt-PSM 7 and detects a pattern of a light shielding film on the Alt-PSM 7. A reflected light having been reflected by the Alt-PSM 7 passes through the objective lens 6. After that, the light is reflected by the beam splitter 5 to enter the beam splitter 10. The objective lens 6 functions as a condenser which concentrates the light beam 2 and also as a light receiving lens. The lens 11 concentrates a reflected light transmitted through the beam splitter 10.

A reflected light from the Alt-PSM 7 which is concentrated by the lens 11 is inputted to the photoelectric converter 12. A detection of a light shielding pattern on the Alt-PSM 7 is performed by using this reflected light. Thus, the photoelectric converter 12 operates as a reflection detecting unit.

A reflected light from the Alt-PSM 7 which is separated by the beam splitter 10 is inputted to the astigmatism detecting unit 100. The astigmatism detecting unit 100 converts a phase distribution of the reflected light from the Alt-PSM 7 into an electric signal and outputs the signal.

The image processing unit 13 receives a signal from the photoelectric converter 12 and the astigmatism detecting unit 100, creates an image of these signals and outputs an inspection image signal of phase defect.

The astigmatism detecting unit 100 includes a beam splitter 101, astigmatism producing optical systems 102 and 105, quadrant detectors 104 and 107, and a computing circuit 108. Light beams on two optical paths that are separated by the beam splitter 101 are inputted to the astigmatism producing optical systems 102 and 105, respectively. The astigmatism producing optical systems 102 and 105 have cylindrical lens 103 and 106, respectively. Light beams which passed through the astigmatism producing optical systems 102 and 105 are inputted to the quadrant detectors 104 and 107, respectively. The computing circuit 108 is a signal calculating section that calculates a signal detected by the quadrant detectors 104 and 107.

Light intensity of a transmitted light and a reflected light detected by a photoelectric converter is not dependent on a phase and is dependent on only amplitude. Therefore, when a phase defect 7a is located in a transparent region of the Alt-PSM 7 illuminated by a concentrated light spot 9, only a phase of an exposure light is changed. Therefore, a conventional inspection apparatus cannot detect a defect. A phase defect in the Alt-PSM 7 means a defect in which a trench of a phase shifter is not formed at a region where the trench is needed, a defect in which a depth of a trench is not a desired one, or the like. Accordingly, as shown in FIG. 1, the inspection apparatus according to the exemplary embodiment is provided with the astigmatism detecting unit 100 on a reflected light path in order to detect the phase defect 7a mentioned above, and detects a phase change amount as an amount of light intensity change.

Since a spot diameter that is concentrated on a pattern to be inspected has to be made small in order to increase a resolution in an SOM, a short wavelength light source is needed. Additionally, in order to improve S/N ratio, a high-intensity light source is needed. By considering these conditions, the light source 1 of the exemplary embodiment utilizes, for example, a far-ultraviolet laser having 266 nm wavelength.

The light beam 2 emitted from the light source 1 is inputted to the scan optical system 3. A beam diameter of the light beam 2 emitted from the scan optical system 3 is changed to a desired size, and is deflected at high speed. For example, an acoustooptic deflector, a polygon mirror or a galvanomirror is employed as a deflection device used for the scan optical system 3.

The light beam 2 (or the light beam 2') which is deflected at high speed transmits through the relay optical system 4 and the beam splitter 5 for a separation of a reflected light, and enters the objective lens 6 to form a desired concentrated light spot 9 on a pattern forming surface of the Alt-PSM 7. The objective lens 6 has a large opening whose numerical aperture (NA) is, for example, 0.85, and forms a very small concentrated light spot 9 of φ 0.3 um through φ 0.4 um on the Alt-PSM 7. A telecentric optical system includes the objective lens 6 and the Alt-PSM 7. The objective lens 6 is configured so that the concentrated light spot 9 telecentricly scans the Alt-PSM 7. The Alt-PSM 7 is scanned by the concentrated light spot 9 so that a light beam from the objective lens 6 to the concentrated light spot 9 on the Alt-PSM 7 is always parallel to an optical axis.

As shown in FIG. 1, the concentrated light spot 9 scans the Alt-PSN 7 in an up and down manner in a plane that is parallel to the plane of FIG. 1. The drive stage 8 moves the Alt-PSM 7 in a direction orthogonal to a scanning direction (a direction vertical to the plane of the drawings). In this way, a surface of the Alt-PSM 7 held by the drive stage 8 is two-dimensionally scanned. Further, as other scanning means, there is a method in which a scan is two-dimensionally performed by moving the concentrated light spot 9. That is, a method in which a surface of the Alt-PSM 7 is scanned in both of a vertical direction and a horizontal direction by moving the concentrated light spot 9 may be used. Additionally, a method in which the Alt-PSM 7 is two-dimensionally moved may be used.

The light beam 2 that has transmitted through the Alt-PSM 7 is led to a transmitted light detecting unit (not shown) to be utilized for a detection of a light shielding pattern using a transmitted light. The light beam 2 reflected by the Alt-PSM 7 transmits through the objective lens 6 again. The beam splitter 10 reflects the light beam 2 output from the objective lens 6. The reflected light beam 2 transmits through the beam splitter 10. The lens 11 concentrates the reflected light beam 2 on the photoelectric converter 12 such as a photodiode to detect a light shielding pattern.

A reflected light from the Alt-PSM 7 that enters the beam splitter 10 transmits through the beam splitter 10 as mentioned above. A part of the reflected light is separated by a reflection in the beam splitter 10 and the separated light is inputted to the astigmatism detecting unit 100. In the astigmatism detecting unit 100, a reflected light from the beam splitter 10 is further divided into two for two optical paths using the beam splitter 101.

One of the separated light beams passes through the astigmatism producing optical system 102 having the cylindrical lens 103 and enters the quadrant detector 104. At this time, the light beam enters the quadrant detector 104 at a position between the cylindrical lens 103 and a focal point of the cylindrical lens 103, and a cross-sectional shape of the light beam becomes circular at the point. That is, the focal point of the cylindrical lens 103 positions inside of the quadrant detector 104, and the cylindrical lens 103, the quadrant detector 104 and the focal point of the cylindrical lens 103 are arranged in sequence on a line connecting the cylindrical lens 103 and the quadrant detector 104.

Other separated light beam passes through the astigmatism producing optical system 105 having the cylindrical lens 106 and enters the quadrant detector 107. At this time, a light beam enters the quadrant detector 107 at a position behind a focal point of the cylindrical lens 106, and a cross-sectional shape of the light beam becomes circular at the point. That is, the focal point of the cylindrical lens 106 positions in front of the quadrant detector 107, and the cylindrical lens 106, the focal point of cylindrical lens 106 and the quadrant detector 107 are arranged in sequence on a line connecting the cylindrical lens 106 and the quadrant detector 107.

A signal calculation of a signal detected by the quadrant detectors 104 and 107 is performed by the computing circuit 108 and the calculated signal is sent to the image processing unit 13 that operates as a defect detecting unit to create an image.

Next, an operation of the embodiment configured as mentioned above, that is, a detecting operation of a phase defect using an astigmatic method will be described in detail. A height of a phase defect 7a to be detected, that is, a phase difference is within several tens of nanometers (hereinafter, nm) to approximately 200 nm. In a phase shift mask, a height difference (i.e. phase difference) between a phase shifter and a light transmission pattern located in neighborhood influenced by light interference action of the phase defect 7a becomes important. Accordingly, when a view of one frame that is an image acquisition unit is a size of approximately 100 μm height×100 μm width, a photomask inspection apparatus using an SOM is required to detect at least a change in a height direction within the view range.

In the exemplary embodiment, a position of the objective lens 6 is controlled so that the Alt-PSM 7 is always positioned within a depth of focus. When an object to be inspected is a photomask, a focusing position does not change rapidly in one frame whose image size is approximately 100 μm ×100 μm. Therefore, it is desirable that a focus control controlling a position of the objective lens 6 is not performed during a period when an image of one frame is acquired. That is, once a focusing is performed, the focusing position is fixed during one frame after that time, since it is necessary to secure detection sensitivity of several tens of nm for the phase defect 7a. If a focus control is performed during a period acquiring an image of one frame and a focal point is adjusted in a direction of a height that is the same as a direction of a phase defect, a detection of a height using an astigmatic method described later becomes impossible. Therefore, when a focus control is needed, a focus control is performed in a period after photographing image of one or more frames and before photographing the next image.

In the exemplary embodiment, in order to detect a phase defect of a photomask or the like, an astigmatic method that is widely used for automatic focus detection is employed. In the astigmatism detecting unit 100, when the objective lens 6 is fixed in a focused state, it is supposed that a cross-sectional shape of a light beam on each light receiving surface of the quadrant detectors 104 and 107 is circular with respect to a reference height in a surface of the Alt-PSM 7. That is, as shown in FIG. 2B, since both of shapes of lights 15a and 15b received by the quadrant detectors 104 and 107 are circular, an amount of light in one region of four light receiving regions is the same as that of the other respective regions.

Figure 2A:
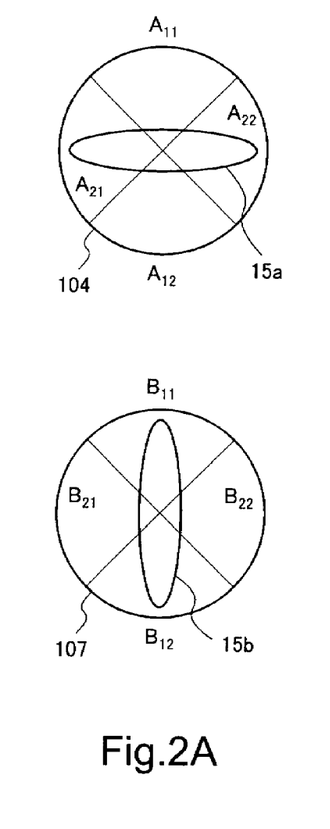
FIG. 2A is a figure showing a cross-sectional shape of a reflected light beam received by a quadrant detector in case of back focus when applying an astigmatic method.

When a surface of the Alt-PSM 7 is photographed under the condition as mentioned above, a change in a height direction on the surface of the Alt-PSM 7 is detected as a change of a focal point position of the astigmatism producing optical systems 102 and 105. That is, a cross-sectional shape of a beam light on the quadrant detectors 104 and 107 changes from a circular to a horizontally long elliptical shape or a vertically long elliptical shape. When height of a surface of the Alt-PSM 7 becomes higher than reference height (that is, when a surface of the Alt-PSM 7 approaches the objective lens 6), a focal point position of the astigmatism producing optical systems 102 and 105 moves backward (that is, toward the quadrant detector 104 and 107). This state may be described as "back focus state". Therefore, as shown in FIG. 2A, a cross-sectional shape of each beam light which is inputted to the quadrant detectors 104 and 107 becomes a horizontally long elliptical shape with respect to the quadrant detector 104 and a vertically long elliptical shape with respect to the quadrant detector 107. Also, when height of a surface of the Alt-PSM 7 becomes lower than a reference height (that is, when a surface of the Alt-PSM 7 goes away from the objective lens 6), a cross-sectional shape of a beam light shows oppositely-directed change from the change above mentioned. This state may be described as "front focus state". That is, as shown in FIG. 2C, a cross-sectional shape of each beam light which is inputted to the quadrant detectors 104 and 107 become a vertically long elliptical shape with respect to the quadrant detector 104 and a horizontally long elliptical shape with respect to the quadrant detector 107.

Figure 2B:
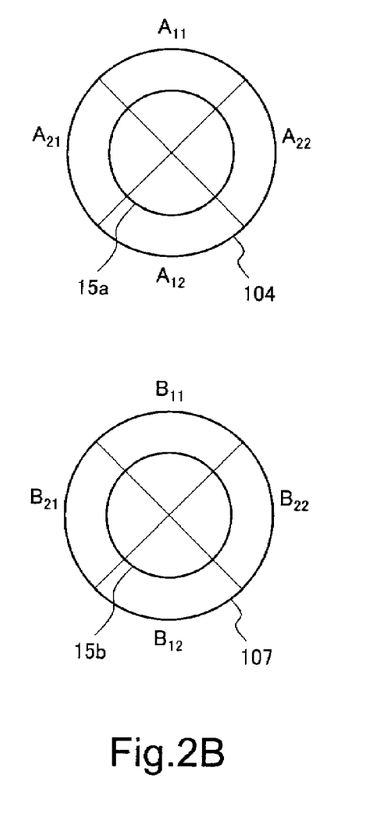
FIG. 2B is a figure showing a cross-sectional shape of a reflected light beam received by a quadrant detector in case of in focus when applying an astigmatic method.
Figure 2C:
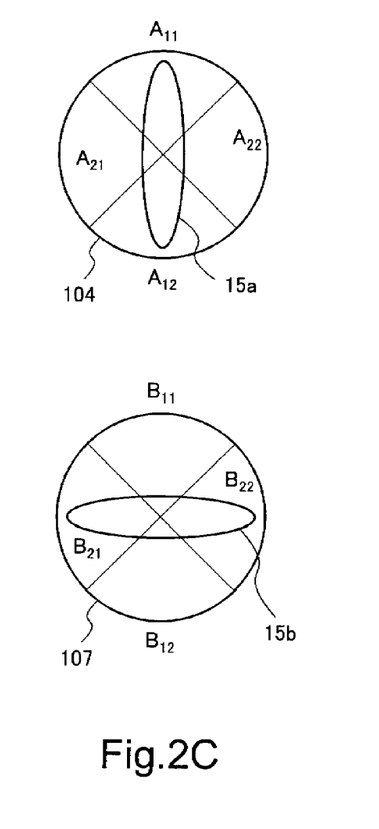
FIG. 2C is a figure showing a cross-sectional shape of a reflected light beam received by a quadrant detector in case of front focus when applying an astigmatic method.

Here, as shown in FIGS. 2A through 2C, a signal detected in each region of four divided regions of the quadrant detector 104 is represented by A11, A12, A21 and A22, respectively. A11 and A12 are signals detected in regions facing each other, and also A21 and A22 are signals detected in regions facing each other. Similarly, a signal detected in each region of four divided regions in the quadrant detector 107 is represented by B11, B12, B21 and B22, respectively. B11 and B12 are signals detected in regions facing each other, and also B21 and B22 are signals detected in regions facing each other.

At this time, a phase defect detection signal P is defined in the following equation.

$$P=(A1-A2)/(A1+A2)-(B1-B2)/(B1+B2)$$

where $$A1=A11+A12, A2=A21+A22, B1=B11+B12 \text{ and } B2=B21+B22.$$

Accordingly, when a position of the quadrant detectors 104 and 107 is adjusted so that a cross-sectional shape of a beam light on the quadrant detectors 104 and 107 becomes a circular beam in case that a height of a surface of the Alt-PSM 7 is a reference value (FIG. 2B), P=0 is obtained. At this time, when a defect exists in which a height of a surface of the Alt-PSM 7 is higher than a reference height, P<0 is obtained since A1−A2<0 and B1−P2>0. On the contrary, when a defect exists in which a height of a surface of the Alt-PSM 7 is lower than a reference height, P>0 is obtained.

On the other hand, a reflected light intensity signal R that is proportional to a reflectivity of a pattern of a light shielding film on the Alt-PSM 7 is detected from a reflected light that has transmitted through the beam splitter 10 and is led to a reflection detecting unit having the photoelectric converters 12. The reflected light intensity signal R enters the image processing system 13. The phase defect detection signal P outputted from the astigmatism detecting unit 100 also enters the image processing unit 13. A difference signal which is obtained by subtracting the phase defect detection signal P from the reflected light intensity signal R is an inspection image signal of phase defect I.

Further, a light intensity proportional to a transmission factor at each point of the Alt-PSM 7 can also be detected from a transmitted light which has transmitted through the Alt-PSM 7 and is led to the transmitted light detecting unit. As a result, a detection of a light shielding pattern on the Alt-PSM 7 can be performed. That is, by calculating a difference between the phase defect detection signal P outputted from the astigmatism detecting unit 100 and a light intensity of a transmitted light at each point of the Alt-PSM 7, an inspection image signal of phase defect can be obtained.

Figure 3A:
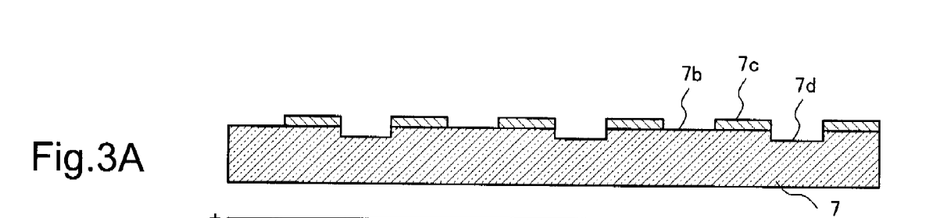
FIG. 3A is a cross sectional view of an Alt-PSM having no phase defect in a first exemplary embodiment according to the present invention.

Next, a phase defect inspection image will be described in detail using FIGS. 3A through 3D, FIGS. 4A through 4D and FIGS. 5A through 5D. FIG. 3A is an example of a cross sectional view of the Alt-PSM 7 when a phase defect does not exist, and FIGS. 3B through 3D are examples of a view showing image signals that are obtained by inspecting the Alt-PSM 7 shown in FIG. 3A by the defect inspection apparatus of the embodiment.

As shown in FIG. 3A, with respect to the Alt-PSM 7, a light shielding film 7c is formed on a clear base such as glass using Cr or the like, and a light transmission patterns 7b and 7d are formed. The light shielding film 7c forms a light shielding pattern. A light transmission pattern 7d is a trenched pattern formed in the Alt-PSM 7 and is a phase shifter. Accordingly, a phase of a transmitted light which has transmitted through the light transmission pattern 7d is shifted by 180 degrees from a phase of the transmitted light which has transmitted through the light transmission pattern 7b. In lithography using an Alt-PSM, interference between a transmitted light whose phase is shifted and an original transmitted light is used.

Figure 3B:
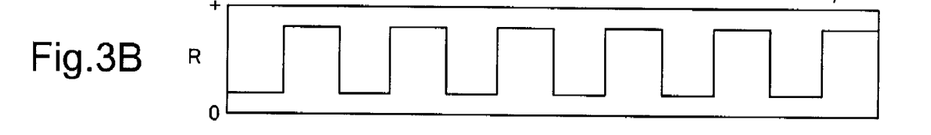
FIG. 3B is a wave form chart of a reflected signal corresponding to a cross-sectional shape of an Alt-PSM shown in FIG. 3A.

FIG. 3B shows a reflected light intensity signal R (i.e. a signal obtained by the photoelectric converter 12 shown in FIG. 1) corresponding to a cross-sectional shape shown in FIG. 3A. The photoelectric converter 12 outputs a signal that is proportional to a reflectivity of a surface of the Alt-PSM 7. Therefore, a light intensity of the signal corresponding to a region where the light shielding film 7c is formed is large.

Figure 3C:
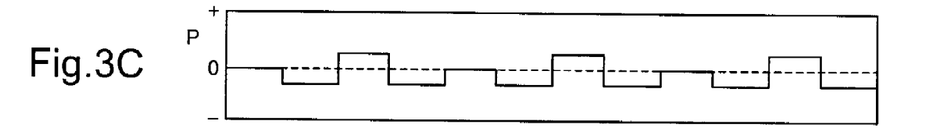
FIG. 3C is a wave form chart of a phase defect detection signal outputted from a computing circuit of an astigmatism optical system corresponding to a cross-sectional shape of an Alt-PSM shown in FIG. 3A.
Figure 3D:
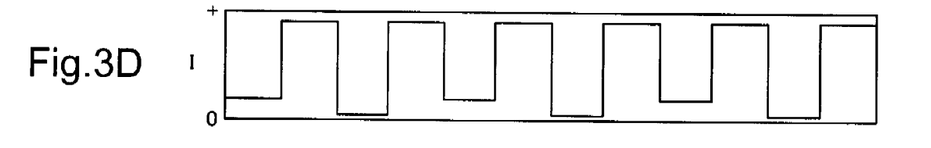
FIG. 3D is a wave form chart of a difference signal between a reflected signal shown in FIG. 3B and an astigmatism signal shown in FIG. 3C.

FIG. 3C shows the phase defect detection signal P outputted from the computing circuit 108 of the astigmatism detecting unit 100 corresponding to a cross-sectional shape shown in FIG. 3A. A focus control when detecting a reflected light from a surface of the light transmission pattern 7b by an astigmatic optical system is performed so that a cross-sectional shape of a light beam on a quadrant detector becomes circular as shown in FIG. 2B when a height of a surface of the light transmission pattern 7b is equal to a reference height. Accordingly, a calculation of signal strength is performed under the condition that a height of a surface of the light transmission pattern 7b is equal to a reference height. In FIG. 3C, the phase defect detection signal P=0 in a region of the light transmission pattern 7b. A strength of a phase defect detection signal has a positive value (P>0) in a region where the light transmission pattern 7d that is a phase shifter is located. As mentioned above, this is because a height of a surface of the light transmission pattern 7d is lower than a height of a surface of the light transmission pattern 7b that is a reference height. On the other hand, since a height of a surface of the light shielding film 7c is higher than a height of a surface of the light transmission pattern 7b that is a reference height, a phase defect detection signal has a negative value (P<0).

FIG. 3D shows the inspection image signal of phase defect I including phase information, the signal being a difference signal R−P between the reflected light intensity signal R shown in FIG. 3B and the phase defect detection signal P shown in FIG. 3C. Further, since the Alt-PSM 7 shown in FIG. 3A has no defect, it can be treated as a standard Die in a Die to Die comparison inspection mentioned below.

Figure 4A:
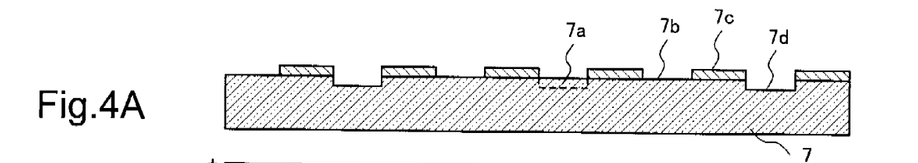
FIG. 4A is a cross sectional view of an Alt-PSM having a phase defect in which no trench part exist at a region where a trench part is required in a first exemplary embodiment according to the present invention.
Figure 4B:
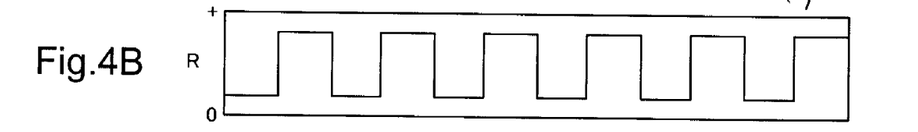
FIG. 4B is a wave form chart of a reflected signal corresponding to a cross-sectional shape of an Alt-PSM shown in FIG. 4A.

Next, a phase defect inspection image of the Alt-PSM 7 having a phase defect will be described. FIGS. 4A through 4D show an example of cross sectional views of an Alt-PSM having a phase defect in which a height of a surface of an Alt-PSM is higher than a normal height. That is, the Alt-PSM 7 shown in FIG. 4A has a phase defect 7a in which a depth of a trench is insufficient in comparison with that shown in FIG. 3A. In an example shown in FIG. 4A, a height of a surface of the phase defect 7a is same as a height of a surface of the light transmission pattern 7b that is a reference height. In this case, since a reflected light intensity signal R obtained by a detection of a reflected light shown in FIG. 4B is the same as a reflected signal shown in FIG. 3B, a reflection detecting unit can not detect the phase defect 7a. As mentioned above, this is because in reflection detection, a light intensity of a reflected light beam does not depend on the phase and depends on only the amplitude.

Figure 4C:
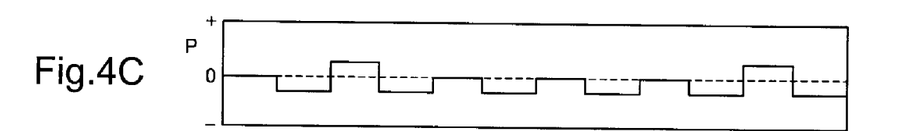
FIG. 4C is a wave form chart of a phase defect detection signal outputted from a computing circuit of an astigmatism optical system corresponding to a cross-sectional shape of an Alt-PSM shown in FIG. 4A.
Figure 4D:
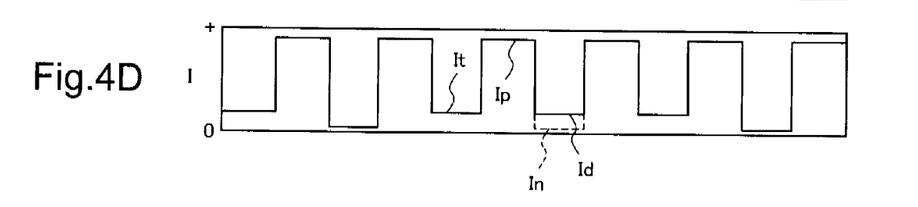
FIG. 4D is a wave form chart of a difference signal between a reflected signal shown in FIG. 4B and an astigmatism signal shown in FIG. 4C.

In contrast, in an astigmatic method, a light intensity changes due to a phase difference being detected. In FIG. 4C, the phase defect detection signal P=0 in a region where the phase defect 7a is located. The signal P is different from a positive detected value shown in FIG. 3C. Therefore, as a result, as shown in FIG. 4D, a phase defect image signal Id that is different from a detected value shown in FIG. 3D is obtained in a part of the detection image signal of phase defect I. In FIG. 3D, a normal image signal In represented by a broken line is a detection image signal of phase defect I at a normal case. Thus, it is detectable whether a defect exists or not by comparing the detection image signal of phase defect In at a normal case with a detection image signal of phase defect I that is actually detected.

It can be distinguished whether a detected defect is a phase defect of a light transmission pattern or a shape defect of a light shielding film based on a comparison between a predetermined set level and the detection image signal of phase defect Id shown in FIG. 4D. A defect of a light shielding film includes a case where a light shielding film does not exist in a region where the film is needed or a case where a light shielding film exists in a region where the film is not needed. In an example shown in FIG. 4D, a level of a detection image signal of phase defect Ip in a region where a light shielding film exists is two times or more than two times of a level of the detection image signal of phase defect It in a region where a light transmission pattern is located. Accordingly, for example, if the detection image signal of phase defect Id is less than or equal to a half of the It, a defect can be judged as a phase defect of a light transmission pattern. If Id is two times or more than two times of It, a defect is judged as a defect of a light shielding film. In an example shown in FIG. 4D, since Id<2It, a defect is judged as a phase defect. Otherwise, by performing a magnitude comparison between a half of It and Id, a type of a defect may be distinguished.

Since an inspection image signal of phase defect I shown in FIG. 4D that is obtained by a method as mentioned above is a difference between the reflected light intensity signal R of a light shielding pattern and a phase defect signal P, both of a shape defect and a phase defect of a light shielding pattern can be detected simultaneously. For example, by performing a Die to Die comparison inspection (i.e. comparison inspection between a die to be inspected and a standard die) based on the configuration shown in FIGS. 4A through 4D and FIGS. 3A through 3D, a defect can be detected.

Figure 5A:
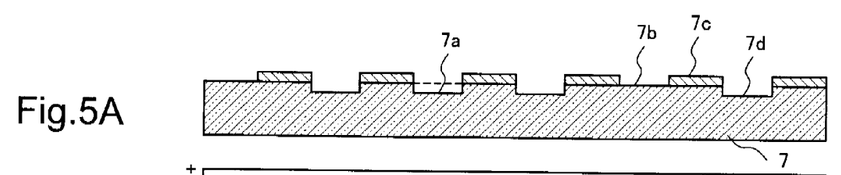
FIG. 5A is a cross sectional view of an Alt-PSM having a phase defect in which a trench part exists at a region where no trench part is required in the first exemplary embodiment according to the present invention.
Figure 5B:
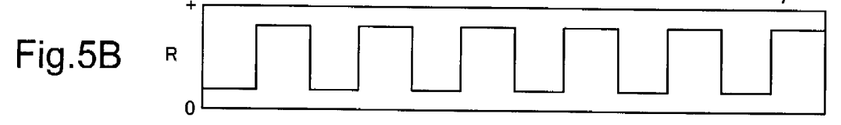
FIG. 5B is a wave form chart of a reflected signal corresponding to a cross-sectional shape of an Alt-PSM shown in FIG. 5A.
Figure 5C:
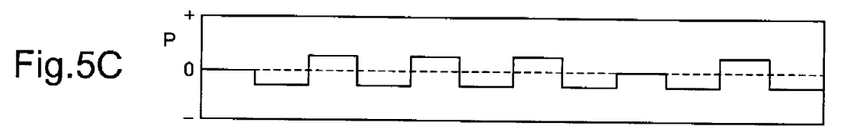
FIG. 5C is a wave form chart of a phase defect detection signal outputted from a computing circuit of an astigmatism optical system corresponding to a cross-sectional shape of an Alt-PSM shown in FIG. 5A.
Figure 5D:
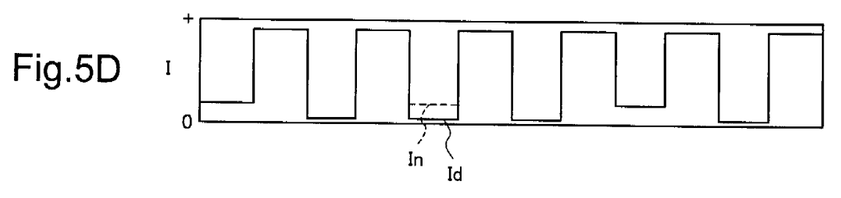
FIG. 5D is a wave form chart of a difference signal between a reflected signal shown in FIG. 5B and an astigmatism signal shown in FIG. 5C.

FIGS. 5A through 5D show an example of a cross sectional views of an Alt-PSM having a phase defect in which a height of a surface of an Alt-PSM is lower than a normal height. That is, the Alt-PSM 7 shown in FIG. 5A has a phase defect 7a in which a trench is formed in a region where the trench is not needed in comparison with that of FIG. 3A. In an example shown in FIG. 5A, a height of a surface of the phase defect 7a is same as a height of a surface of the light transmission pattern 7d. In this case, a reflected light intensity signal R obtained by a detection of a reflected light shown in FIG. 5B is the same as a light intensity obtained by a reflection detection shown in FIG. 3B. In contrast, in an astigmatic method, a light intensity changes due to a phase difference being detected. That is, in FIG. 5C, the phase defect detection signal P has a positive value in a region where the phase defect 7a is located and the value is different from 0 in FIG. 3C. Therefore, as a result, as shown in FIG. 5D, the phase defect image signal Id that is different from a detected value shown in FIG. 3D is obtained in a part of the detection image signal of phase defect I. As understood from FIG. 3D, a normal image signal In represented by a broken line is a detection image signal of phase defect I at a normal case. Thus, it is detectable whether a defect exists or not by comparing the detection image signal of phase defect In at a normal case with a detection image signal of phase defect I that is actually detected.

Since an inspection image signal of phase defect I shown in FIG. 5D obtained by a method as mentioned above is a difference between the reflected light intensity signal R of a light shielding pattern and a phase defect signal P, both of a shape defect and a phase defect of a light shielding pattern can be detected simultaneously. For example, by performing a Die to Die comparison inspection based on the configuration shown in FIGS. 5A through 5D and FIGS. 3A through 3D, a defect can be detected.

An exemplary embodiment of a method for performing a Die to Die comparison inspection is described. At first, a whole surface of one sheet of Alt-PSM is scanned to obtain an inspection image signal of phase defect and the signal is stored in a storage apparatus provided in the image processing unit 13. The image processing unit 13 generates an inspection image signal of phase defect while scanning the Alt-PSM that is an object to be compared and simultaneously compares the signal with a stored inspection image signal of phase defect I. The image processing unit 13 outputs the comparison result. If any level difference is observed for two signals which are compared, it can be judged that at least one of Alt-PSMs has a defect. If an Alt-PSM, such as the Alt-PSM shown in FIG. 3A to which it is previously confirmed that it has no defect, is used as a standard Die, it can be immediately determined whether an Alt-PSM that is an object to be compared has a defect or not.

In examples shown in FIGS. 3A through 3D, FIGS. 4A through 4D and FIGS. 5A through 5D, a case that a trench exists and a case that a trench does not exist are described. In case that an object to be detected is a matter of depth to be engraved as a trench, such as a case that a depth of a trench is different from a design value, a defect can also be detected by the same manner as a detection of whether a trench exist or not.

Further, without using the difference signal as shown in FIG. 3D, FIG. 4D and FIG. 5D as an inspection image, by using the reflected light intensity signal R shown in FIG. 3B, FIG. 4B and FIG. 5B, a defect of a light shielding pattern can be detected by a conventional method. With respect to only a part that is judged as a light transmission pattern by the reflected light intensity signal R shown in FIG. 3B, FIG. 4B and FIG. 5B, it is determined whether a phase defect exists or not using an inspection image by an astigmatic method shown in FIG. 3C, FIG. 4C and FIG. 5C. Further, it is possible to detect a pattern defect by comparing only the inspection images by the astigmatic method shown in FIG. 3C, FIG. 4C and FIG. 5C. However, in this method, it is impossible to determine whether it is a shape defect of a light shielding film or a phase defect of a phase shifter. Accordingly, a method in which only the inspection images by an astigmatic method are compared may be applied to a case of judging only whether a defect exist or not.

Further, in this exemplary embodiment, as an optical path of an astigmatic optical system, two optical paths are provided to double sensitivity, a front focus optical path expressed by an astigmatism producing optical system 102 shown in FIG. 1 and a back focus optical path expressed by an astigmatism producing optical system 105. It is possible to detect a phase defect by using only either of the two optical paths.

In the exemplary embodiment, a method in which a die to be inspected is compared with a standard die including the same pattern in a photomask, that is, a defect detection method based on a Die to Die comparison inspection method is described. It is possible to use a method in which a reference image is produced from a design database of a mask pattern using theoretical calculation and a comparison is performed, that is, a Die to Database comparison inspection method. A defect inspection method based on the Die to Database comparison inspection method is a similar to the Die to Die comparison inspection method mentioned above. That is, an inspection image signal of phase defect I of an Alt-PSM that is an object to be inspected which is obtained by a theoretical calculation is stored in a storage apparatus provided in an image processing unit as a design database. An actual inspection image signal of phase defect I is sequentially compared with a phase defect inspection image signal I that is a theoretical calculation result stored in the storage apparatus and a result may be outputted.

Finally, an advantage of the exemplary embodiment will be described. According to the embodiment, in a photomask defect inspection apparatus, by using an astigmatic method, an amount of a phase change is detected as an amount of a light intensity change. Therefore, complicated optical means or analyzing means of a signal or an image is not needed, and a high accurate detection of a phase defect can be performed readily and at high speed.

An inspection of a pattern shape can be simultaneously performed like a usual pattern defect inspection. Therefore, even when an inspection of a photomask including both of a light shielding pattern and a phase shifter is performed, it is possible to detect and specify each defect.

Since a single beam spot is applied to a photomask, there is no dependency on a pattern shape and a direction. Since defect signal that is the same as the signal obtained by a conventional pattern shape defect inspection is obtained, a conventional algorithm for defect detection can be used.

Moreover, a photomask defect inspection apparatus of the embodiment employs an SOM. Therefore, a high S/N ratio that is an advantage of an SOM can be secured and a defect signal is not masked by noise.

2. Second Exemplary Embodiment

In the first exemplary embodiment, an Alt-PSM is taken as a sample of a phase shift mask and a defect detection method thereof is described.

The present invention can be similarly applied to an Attenuated Phase Shit Mask (Att-PSM). In case of an Att-PSM, a translucent pattern is formed as a light shielding pattern. Since a phase of a light beam shifts by 180 degrees when transmitting through a translucent pattern, a translucent pattern can be used as a phase shifter in case of an Att-PSM. Thus, an Att-PSM obtains an advantage of a phase shift which is the same as that of an Alt-PSM by using a translucent pattern.

A height of a region where a translucent pattern is formed is different from a height of an opening. A light intensity of a reflected light from a region where a light shielding pattern is formed is different from a light intensity of a reflected light from an opening. Accordingly, when inspecting a pattern of an Att-PSM, a reflected light from an Att-PSM can be used similarly to a case of an Alt-PSM. When inspecting a pattern of an Att-PSM, an inspection apparatus shown in FIG. 1 can be used.

Figure 6A:
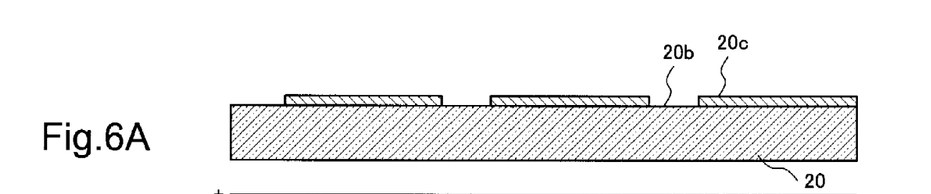
FIG. 6A is a cross sectional view of an Att-PSM having no phase defect in a second exemplary embodiment according to the present invention.
Figure 6B:
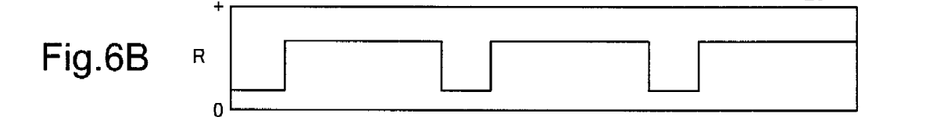
FIG. 6B is a wave form chart of a reflected signal corresponding to a cross-sectional shape of an Att-PSM shown in FIG. 6A.
Figure 6C:
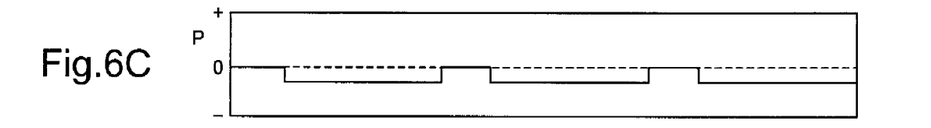
FIG. 6C is a wave form chart of a phase defect detection signal outputted from a computing circuit of an astigmatism optical system corresponding to a cross-sectional shape of an Att-PSM shown in FIG. 6A.
Figure 6D:
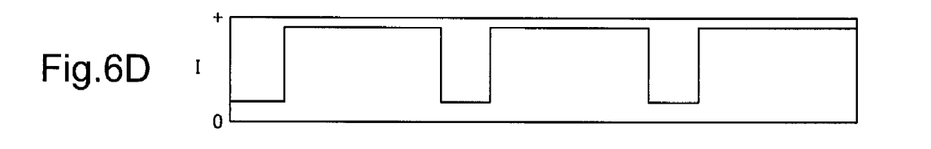
FIG. 6D is a wave form chart of a difference signal between a reflected signal shown in FIG. 6B and an astigmatism signal shown in FIG. 6C.

Next, a phase defect inspection image is described by using FIGS. 6A through 6D, FIGS. 7A through 7D and FIGS. 8A through 8D in a case that a pattern of an Att-PSM is inspected by using an inspection apparatus shown in FIG. 1. FIG. 6A shows an example of a cross sectional view of the Att-PSM 20 when a phase defect does not exist, FIGS. 6B through 6D show a signal waveform diagram when the Att-PSM 20 shown in FIG. 6A is inspected by the inspection apparatus shown in FIG. 1 and an image signal is outputted.

As shown in FIG. 6A, a translucent light shielding film 20c is formed on the Att-PSM 20 by using a translucent material on a clear base such as glass, and a light transmission pattern 20b is formed. The translucent light shielding film 20c itself forms a translucent pattern. A phase of a transmitted light which has transmitted through a translucent light shielding film 20c is shifted by 180 degrees to a phase of a transmitted light which has transmitted through the light transmission pattern 20b. In the Att-PSM, interference between a transmitted light whose phase is shifted and a transmitted light with an original phase is used.

FIG. 6B shows a reflected light intensity signal R (i.e. a signal obtained by the photoelectric converter 12 shown in FIG. 1) corresponding to a cross-sectional shape shown in FIG. 6A. The photoelectric converter 12 outputs a signal proportional to a reflectivity of a surface of the Att-PSM 20. Therefore, a light intensity of a signal in a region where the translucent light shielding film 20c is formed is large.

FIG. 6C shows a phase defect detection signal P outputted from the computing circuit 108 of the astigmatism detecting unit 100 corresponding to a cross-sectional shape shown in FIG. 6A. A focus control when detecting a reflected light from a surface of the light transmission pattern 20b by an astigmatic optical system is performed so that a cross-sectional shape of a light beam in a quadrant detector becomes circular as shown in FIG. 2B when a height of a surface of the light transmission pattern 20b is set as a reference height. Accordingly, signal strength is calculated under the condition that a height of a surface of the light transmission pattern 20b is a reference height. In FIG. 6C, the phase defect detection signal P in a region of the light transmission pattern 20b equals zero. Strength of a phase defect detection signal in a region where the translucent light shielding film 20c is located is negative (i.e. P<0). This is because a height of a surface of the translucent light shielding film 20c is higher than a height of a surface of the light transmission pattern 20b that is a reference height.

FIG. 6D shows the inspection image signal of phase defect I including phase information that is a difference signal R−P between the reflected light intensity signal R shown in FIG. 6B and the phase defect detection signal P shown in FIG. 6C. Further, FIG. 6A shows the Att-PSM 20 that has no defect. The Att-PSM 20 that has no defect is treated as a standard Die.

Next, a phase defect inspection image when the Att-PSM 20 has a phase defect will be described. A phase defect in the Att-PSM 20 is a defect in which a translucent light shielding film is not formed in a region where the film is needed or a defect in which a thickness of the film is not desired one although the translucent light shielding film exists. FIGS. 7A through 7D show an example of a cross sectional view of an Att-PSM in which a required translucent light shielding film is not formed. That is, the Att-PSM 20 shown in FIG. 7A has the phase defect 20a in which a translucent light shielding film is not formed. In an example of FIG. 7A, a height of a surface of the phase defect 20a is equal to a height of a surface of the light transmission pattern 20b that is a reference height. However, since a reflectivity of the translucent light shielding film 20c is different from a reflectivity of the light transmission pattern 20b, a reflected light intensity signal R is different from a reflected light intensity signal R at a normal case.

Figure 7A:
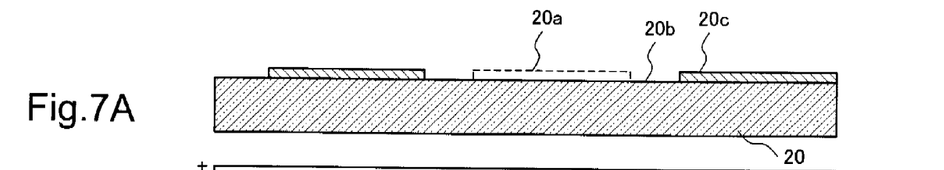
FIG. 7A is a cross sectional view of an Att-PSM having a phase defect in which any translucent light shielding film does not exist at a region where a translucent light shielding film is required in a second exemplary embodiment according to the present invention.
Figure 7B:
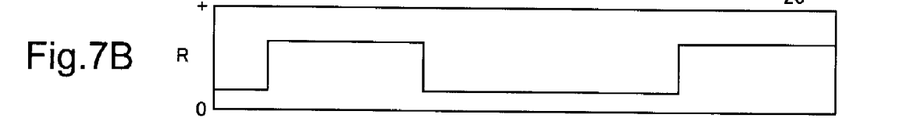
FIG. 7B is a wave form chart of a reflected signal corresponding to a cross-sectional shape of an Att-PSM shown in FIG. 7A.
Figure 7C:
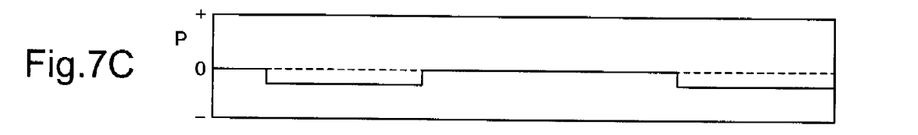
FIG. 7C is a wave form chart of a phase defect detection signal outputted from a computing circuit of an astigmatism optical system corresponding to a cross-sectional shape of an Att-PSM shown in FIG. 7A.
Figure 7D:
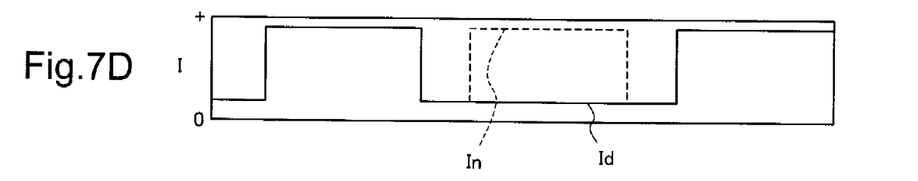
FIG. 7D is a wave form chart of a difference signal between a reflected signal shown in FIG. 7B and an astigmatism signal shown in FIG. 7C.

In an astigmatic method, a light intensity changes due to a phase difference being detected. That is, the phase defect detection signal P in a region where the phase defect 20a exists becomes zero in FIG. 7C and it is different from a negative detection value in FIG. 6C. Therefore, as a result, as shown in FIG. 7D, a phase defect image signal Id that is different from a detection value in FIG. 6D is obtained in a part of the detection image signal of phase defect I. As shown in FIG. 7D, a normal image signal In represented by a broken line is a phase defect inspection signal I at a normal case. Thus, it is known whether a defect exists or not by comparing the phase defect detection signal In at a normal case and a phase defect inspection signal I that is actually detected.

Since an inspection image signal of phase defect I shown in FIG. 7D obtained by a method as mentioned above is a difference between the reflected light intensity signal R of a light shielding pattern and a phase defect signal P, both of a shape defect and a phase defect of a light shielding pattern can be detected simultaneously. For example, by performing a Die to Die comparison inspection based on the configuration shown in FIGS. 7A through 7D and FIGS. 6A through 6D, a defect can be detected.

Figure 8A:
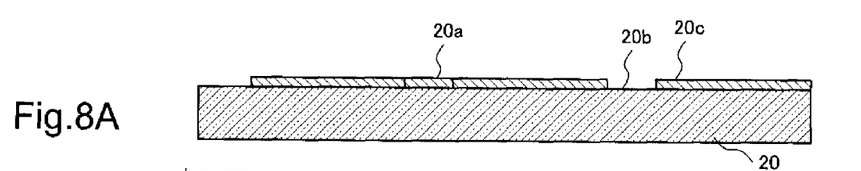
FIG. 8A is a cross sectional view of an Att-PSM having a phase defect in which a translucent light shielding film exist at a region where any translucent light shielding film is not required in a second exemplary embodiment according to the present invention.
Figure 8B:
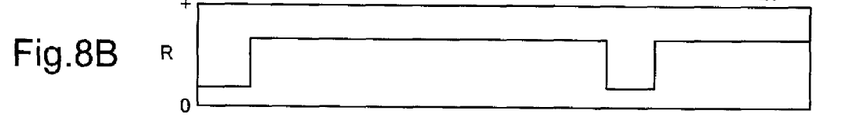
FIG. 8B is a wave form chart of a reflected signal corresponding to a cross-sectional shape of an Att-PSM shown in FIG. 8A.
Figure 8C:
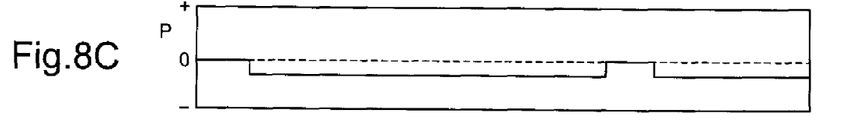
FIG. 8C is a wave form chart of a phase defect detection signal outputted from a computing circuit of an astigmatism optical system corresponding to a cross-sectional shape of an Att-PSM shown in FIG. 8A.
Figure 8D:
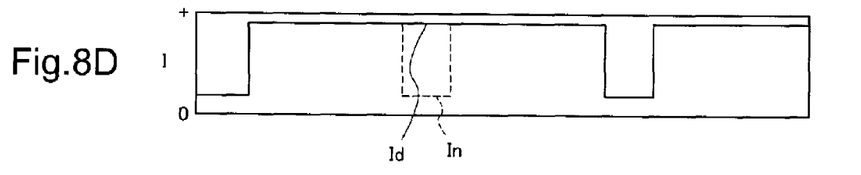
FIG. 8D is a wave form chart of a difference signal between a reflected signal shown in FIG. 8B and an astigmatism signal shown in FIG. 8C.

FIGS. 8A through 8D show examples of a cross sectional views of the Att-PSM when a phase defect in which a height of a surface of the Att-PSM is higher than a reference height exists. That is, the Att-PSM 20 shown in FIG. 8A has a phase defect 20a in which a translucent light shielding film is formed in a region where a light transmission pattern has to be formed in comparison with FIG. 6A. In an example shown in FIG. 8A, a height of a surface of the phase defect 20a is equal to a height of a surface of the translucent light shielding film 20c. In this case, a part of the reflected light intensity signal R obtained by a detection of a reflected light shown in FIG. 8B is different from a light intensity obtained by a reflection detection shown in FIG. 6B. Accordingly, since a phase difference is detected in an astigmatic method, a light intensity changes. That is, the phase defect detection signal P in a region where the phase defect 20a exists is a negative value in FIG. 8C and it is different from 0 in FIG. 6C. Therefore, as shown in FIG. 8D, the phase defect image signal Id that is different from a detection value in FIG. 6D is obtained in a part of the detection image signal of phase defect I. In FIG. 8D, a normal image signal In represented by a broken line is a detection image signal of phase defect I at a normal case. Thus, it is known whether a defect exists or not by comparing the detection image signal of phase defect In at a normal case and a detection image signal of phase defect I that is actually detected.

Since an inspection image signal of phase defect I shown in FIG. 8D obtained by a method as mentioned above is a difference between the reflected light intensity signal R of a light shielding pattern and a phase defect signal P, both of a shape defect and a phase defect of a light shielding pattern can be detected simultaneously. For example, by performing a Die to Die comparison inspection based on the configuration shown in FIGS. 8A through 8D and FIGS. 6A through 6D, a defect can be detected.

Further, a defect can be detected based on not only a Die to Die comparison inspection method but also a Die to Database comparison inspection method. An explanation of these inspection methods has been made in an explanation of an Alt-PSM. Therefore, the same explanation will be omitted here.

As described in the second exemplary embodiment, a defect inspection method and a defect inspection apparatus according to the present invention have an advantage that these can be used to inspect a pattern of not only an Alt-PSM but also an Att-PSM.

Moreover, the defect inspection method and the defect inspection apparatus according to the present invention detect a distribution of a reflectivity and a distribution of a height of a pattern of an object to be inspected by using a configuration that uses a SOM as a base technology. Therefore, the defect inspection method and the defect inspection apparatus according to the present invention also have the same effect with respect to an object whose reflectivity or height varies, besides a photomask. For example, the method and apparatus have the same effect with respect to a detection of a defect such as a defect of a film thickness, adhesion of a foreign substance etc. Additionally, the defect inspection method and the defect inspection apparatus of the present invention can also be applied to a detection of a surface condition of an electronic device having fine patterns, etc.

The previous description of embodiments is provided to enable a person skilled in the art to make and use the present invention.

Moreover, various modifications to these embodiments will be readily apparent to those skilled in the art, and the generic principles and specific examples defined herein may be applied to other embodiments without the use of inventive faculty.

Therefore, the present invention is not intended to be limited to the embodiments described herein but is to be accorded the widest scope as defined by the limitations of the claims and equivalents.

Further, it is noted that the inventor's intent is to retain all equivalents of the claimed invention even if the claims are amended during prosecution.

This application is based on Japanese Patent Application No. JP 2006-170327 filed on Jun. 20, 2006, and including a specification, claims, drawings and summary. The disclosure of the above Japanese Patent Application is incorporated herein by reference in its entirety.

While this invention has been described in connection with certain preferred embodiments, it is to be understood that the subject matter encompassed by way of this invention is not to be limited to those specific embodiments. On the contrary, it is intended for the subject matter of the invention to include all alternative, modification and equivalents as can be included within the spirit and scope of the following claims.

Further, it is the inventor's intention to retain all equivalents of the claimed invention even if the claims are amended during prosecution.

What is claimed is:

1. An apparatus for inspecting a pattern, comprising:
a light source which emits a light beam;
a condenser which concentrates the light beam on the pattern to form a light spot;
a scanning unit which scans the pattern using the light spot;
a beam splitter which separates a light beam reflected from a position of the light spot on the pattern into a first reflected light beam on a first optical path and a second reflected light beam on a second optical path;
a reflection detecting unit which receives the first reflected light beam and outputs a first light intensity signal;
an astigmatism detecting unit which receives the second reflected light beam and outputs a second light intensity signal by an astigmatic method which second light intensity signal represents a distribution of a phase of the second reflected light beam; and
an image processing unit which outputs an inspection image signal representing an inspection result of the pattern based on the first light intensity signal and the second light intensity signal.

2. The apparatus for inspecting a pattern according to claim 1, wherein
the pattern includes a light shielding pattern formed by a light shielding film that is arranged on a surface of a base or a translucent pattern formed by a translucent light shielding film that is arranged on a surface of a base.

3. The apparatus for inspecting a pattern according to claim 1, wherein
the pattern includes a phase shifter which is arranged on a surface of a base.

4. The apparatus for inspecting a pattern according to claim 2, wherein
the pattern includes a phase shifter which is arranged on a surface of a base.

5. The apparatus for inspecting a pattern according to claim 1, wherein
the image processing unit outputs the inspection image signal based on a difference signal between the first light intensity signal and the second light intensity signal.

6. The apparatus for inspecting a pattern according to claim 1, further comprising:
a transmitted light detecting unit which outputs a light intensity signal of a transmitted light applied to the pattern as the light spot and transmitting therethrough.

7. The apparatus for inspecting a pattern according to claim 1, wherein
the light source is a laser light source.

8. The apparatus for inspecting a pattern according to claim 1, wherein
the astigmatism detecting unit comprises an astigmatism generating optical system including a cylindrical lens, a quadrant detector and a signal calculation unit which performs a calculation of a signal detected by the quadrant detector to output the second light intensity signal.

9. The apparatus for inspecting a pattern according to claim 1, wherein
the astigmatism detecting unit includes a beam splitter which separates the reflected light beam on the second optical path into a light on a third optical path and a light on a fourth optical path;
a first astigmatism generating optical system which includes a cylindrical lens and a first quadrant detector which are both provided on the third optical path;
a second astigmatism generating optical system which includes a cylindrical lens and a second quadrant detector which are both provided on the fourth optical path; and
a signal calculation unit which performs a calculation of a signal detected by the first and second quadrant detectors to output the second light intensity signal.

10. The apparatus for inspecting a pattern according to claim 1, wherein
the image processing unit comprises a storage apparatus which stores a first inspection image signal that represents an inspection result of a first pattern, and
the image processing unit outputs a result of a comparison between a second inspection image signal which represents an inspection result of a second pattern and the first inspection image signal.

11. The apparatus for inspecting a pattern according to claim 1, wherein
the image processing unit includes a storage apparatus which stores a first inspection image signal that is calculated based on a design database of a first pattern, and
the image processing unit outputs a result of a comparison between a second inspection image signal which represents an inspection result of a second pattern and the first inspection image signal.

12. A method for inspecting a pattern, comprising:
scanning the pattern using a light spot on which a light beam from a light source is concentrated;
separating a reflected light beam from a position of the light spot on the pattern into a first reflected light beam on a first optical path and a second reflected light beam on a second optical path;
detecting a first light intensity signal of the first reflected light beam;
detecting a second light intensity signal from the second reflected light beam by an astigmatic method which second light intensity signal represents a distribution of a phase of the second reflected light beam; and
outputting an inspection image signal which represents an inspection result of the pattern based on the first light intensity signal and second light intensity signal.

13. The method for inspecting a pattern according to claim 12, wherein
the pattern includes a light shielding pattern formed by a light shielding film that is arranged on a surface of a base or a translucent pattern formed by a translucent light shielding film that is arranged on a surface of a base.

14. The method for inspecting a pattern according to claim 12, wherein
the pattern includes a phase shifter that is arranged on a surface of a base.

15. The method for inspecting a pattern according to claim 13, wherein
the pattern includes a phase shifter that is arranged on a surface of the base.

16. The method for inspecting a pattern according to claim 12, wherein the inspection image signal is outputted based on a difference signal between the first light intensity signal and second light intensity signal.

17. The method for inspecting a pattern according to claim 14, wherein
the inspection image signal is outputted based on a difference signal between the first light intensity signal and second light intensity signal.

18. The method for inspecting a pattern according to claim 12, further comprising;
storing a first inspection image signal which is an inspection result of a first pattern; and
comparing the first inspection image signal with a second inspection image signal which represents an inspection result of a second pattern.

19. The method for inspecting a pattern according to claim 12, further comprising;
storing a first inspection image signal calculated based on a design database of a first pattern; and
comparing the first inspection image signal with a second inspection image signal which represents an inspection result of a second pattern.

* * * * *